(12) United States Patent
Gossner et al.

(10) Patent No.: US 11,373,995 B2
(45) Date of Patent: Jun. 28, 2022

(54) GROUP III-NITRIDE ANTENNA DIODE

(71) Applicant: INTEL CORPORATION, Santa Clara, CA (US)

(72) Inventors: Harald Gossner, Riemerling (DE); Peter Baumgartner, Munich (DE); Uwe Hodel, Putzbrunn (DE); Domagoj Siprak, Munich (DE); Stephan Leuschner, Munich (DE); Richard Geiger, Munich (DE); Han Wui Then, Portland, OR (US); Marko Radosavljevic, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/643,928

(22) PCT Filed: Sep. 29, 2017

(86) PCT No.: PCT/US2017/054632
§ 371 (c)(1),
(2) Date: Mar. 3, 2020

(87) PCT Pub. No.: WO2019/066974
PCT Pub. Date: Apr. 4, 2019

(65) Prior Publication Data
US 2020/0411505 A1    Dec. 31, 2020

(51) Int. Cl.
*H01L 29/778*    (2006.01)
*H01L 27/02*    (2006.01)
(Continued)

(52) U.S. Cl.
CPC ...... *H01L 27/0255* (2013.01); *H01L 21/8252* (2013.01); *H01L 27/0605* (2013.01);
(Continued)

(58) Field of Classification Search
CPC ............. H01L 29/7786; H01L 29/7787; H01L 29/778; H01L 29/66212; H01L 27/0727;
(Continued)

(56) References Cited

U.S. PATENT DOCUMENTS 8,680,564 B2    3/2014  Makino et al.
9,379,104 B1*   6/2016  Wu ........................ H01L 21/845
(Continued)

FOREIGN PATENT DOCUMENTS

JP    2014212151    11/2014
KR    20150063682    6/2015
(Continued)

OTHER PUBLICATIONS

International Search Report and Written Opinion from PCT/US2017/054632 dated Jun. 29, 2018, 10 pgs.
(Continued)

*Primary Examiner* — Grant S Withers
(74) *Attorney, Agent, or Firm* — Essential Patents Group, LLP

(57) ABSTRACT

A Group III-Nitride (III-N) device structure is presented comprising: a heterostructure having three or more layers comprising III-N material, a cathode comprising donor dopants, wherein the cathode is on a first layer of the heterostructure,
an anode within a recess that extends through two or more of the layers of the heterostructure, wherein the anode comprises a first region wherein the anode is separated from the heterostructure by a high k dielectric material, and a second region wherein the anode is in direct contact with the
(Continued)

heterostructure, and a conducting region in the first layer in direct contact to the cathode and conductively connected to the anode. Other embodiments are also disclosed and claimed.

18 Claims, 6 Drawing Sheets

(51) Int. Cl.
H01L 21/8252 (2006.01)
H01L 27/06 (2006.01)
H01L 29/20 (2006.01)
H01L 29/205 (2006.01)
H01L 29/47 (2006.01)
H01L 29/66 (2006.01)
H01L 29/872 (2006.01)
H01L 27/07 (2006.01)

(52) U.S. Cl.
CPC ...... *H01L 27/0727* (2013.01); *H01L 29/2003* (2013.01); *H01L 29/205* (2013.01); *H01L 29/475* (2013.01); *H01L 29/66212* (2013.01); *H01L 29/66462* (2013.01); *H01L 29/7786* (2013.01); *H01L 29/7787* (2013.01); *H01L 29/872* (2013.01)

(58) Field of Classification Search
CPC ............. H01L 29/66462; H01L 29/872; H01L 27/0255
See application file for complete search history.

(56) References Cited

U.S. PATENT DOCUMENTS

| | | |
|---|---|---|
| 9,607,978 B2 | 3/2017 | Deval et al. |
| 9,825,026 B2 | 11/2017 | Twynam |
| 2001/0023964 A1 | 9/2001 | Wu et al. |
| 2004/0238842 A1* | 12/2004 | Micovic ............ H01L 29/7787 257/192 |
| 2006/0118822 A1 | 6/2006 | Murata et al. |
| 2007/0018199 A1 | 1/2007 | Sheppard et al. |
| 2008/0203478 A1* | 8/2008 | Prikhodko ............ H01L 29/407 257/347 |
| 2009/0146182 A1 | 6/2009 | Hikita et al. |
| 2009/0267078 A1 | 10/2009 | Mishra et al. |
| 2010/0140660 A1 | 6/2010 | Wu et al. |
| 2010/0207166 A1 | 8/2010 | Zhu |
| 2010/0327322 A1* | 12/2010 | Kub ............ H01L 29/205 257/194 |
| 2011/0127541 A1 | 6/2011 | Wu et al. |
| 2011/0140172 A1 | 6/2011 | Chu et al. |
| 2011/0147706 A1 | 6/2011 | Radosavljevic et al. |
| 2011/0189837 A1 | 8/2011 | Yu et al. |
| 2012/0223319 A1 | 9/2012 | Dora |
| 2012/0223320 A1 | 9/2012 | Dora |
| 2013/0043484 A1 | 2/2013 | Curatola et al. |
| 2013/0056744 A1 | 3/2013 | Mishra et al. |
| 2013/0092958 A1 | 4/2013 | Chen et al. |
| 2014/0054603 A1 | 2/2014 | Wu et al. |
| 2014/0103357 A1 | 4/2014 | Decoutere et al. |
| 2014/0110759 A1 | 4/2014 | Murata et al. |
| 2014/0210007 A1 | 7/2014 | Deval et al. |
| 2014/0231874 A1* | 8/2014 | Hoshi ................ H01L 29/7786 257/194 |
| 2015/0115139 A1 | 4/2015 | Okushiba |
| 2015/0214327 A1 | 7/2015 | Decoutere et al. |
| 2016/0071832 A1 | 3/2016 | Yoo |
| 2016/0197203 A1 | 7/2016 | Hu |
| 2016/0372634 A1 | 12/2016 | Yoo et al. |
| 2017/0179115 A1* | 6/2017 | Wang ................ H01L 29/7786 |
| 2018/0374848 A1* | 12/2018 | Baines ................ H01L 29/872 |
| 2019/0058049 A1* | 2/2019 | Then ................ H01L 29/7786 |
| 2019/0189441 A1* | 6/2019 | Fujita ................ H01L 21/02579 |
| 2020/0066890 A1* | 2/2020 | Then ................ H01L 29/402 |
| 2020/0220036 A1 | 7/2020 | Azize |

FOREIGN PATENT DOCUMENTS

| | | |
|---|---|---|
| KR | 101535852 | 7/2015 |
| KR | 20150114982 | 10/2015 |

OTHER PUBLICATIONS

International Preliminary Report on Patentability from PCT/US2017/054632 dated Apr. 9, 2020, 7 pgs.
Zhu, Mingda et al., "1,9-kV AlGaN/GaN Lateral Schottky Barrier Diodes on Silicon", IEEE Electron Device Letters, vol. 36,p. No. 4, Apr. 2015, 3 pgs.

* cited by examiner

GROUP III-NITRIDE ANTENNA DIODE

CLAIM OF PRIORITY

This Application is a National Stage Entry of, and claims priority to, PCT Application No. PCT/US2017/054632, filed on 29 Sep. 2017 and titled "GROUP III-NITRIDE ANTENNA DIODE", which is incorporated by reference in its entirety for all purposes.

BACKGROUND

Diodes are a common circuit element used in integrated circuits (ICs). Diodes are useful for protecting circuitry from over-voltages, such as those associated with electrostatic discharge (ESD) events. Absent a protection circuit, discharge through a device such as a transistor, can cause catastrophic damage to an IC. Diodic protection circuits may therefore be configured as part of a functional IC to shunt surges in potential away from circuitry that could otherwise be damaged. Group III-Nitride (IUPAC 13-N) semiconductor materials offer the benefit of a relatively wide bandgap (~3.4 eV), enabling higher breakdown voltages than Si-based devices. Group III-Nitride (III-N) semiconductor materials also offer high carrier mobility. However, III-N diodes with sufficiently low on-resistance tend to be an area-intensive circuit element even when monolithically integrated with transistors of an IC.

III-N diode structures enabling a smaller area are therefore advantageous at least for enabling dimensional scaling of the device platforms that employ them.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1A:
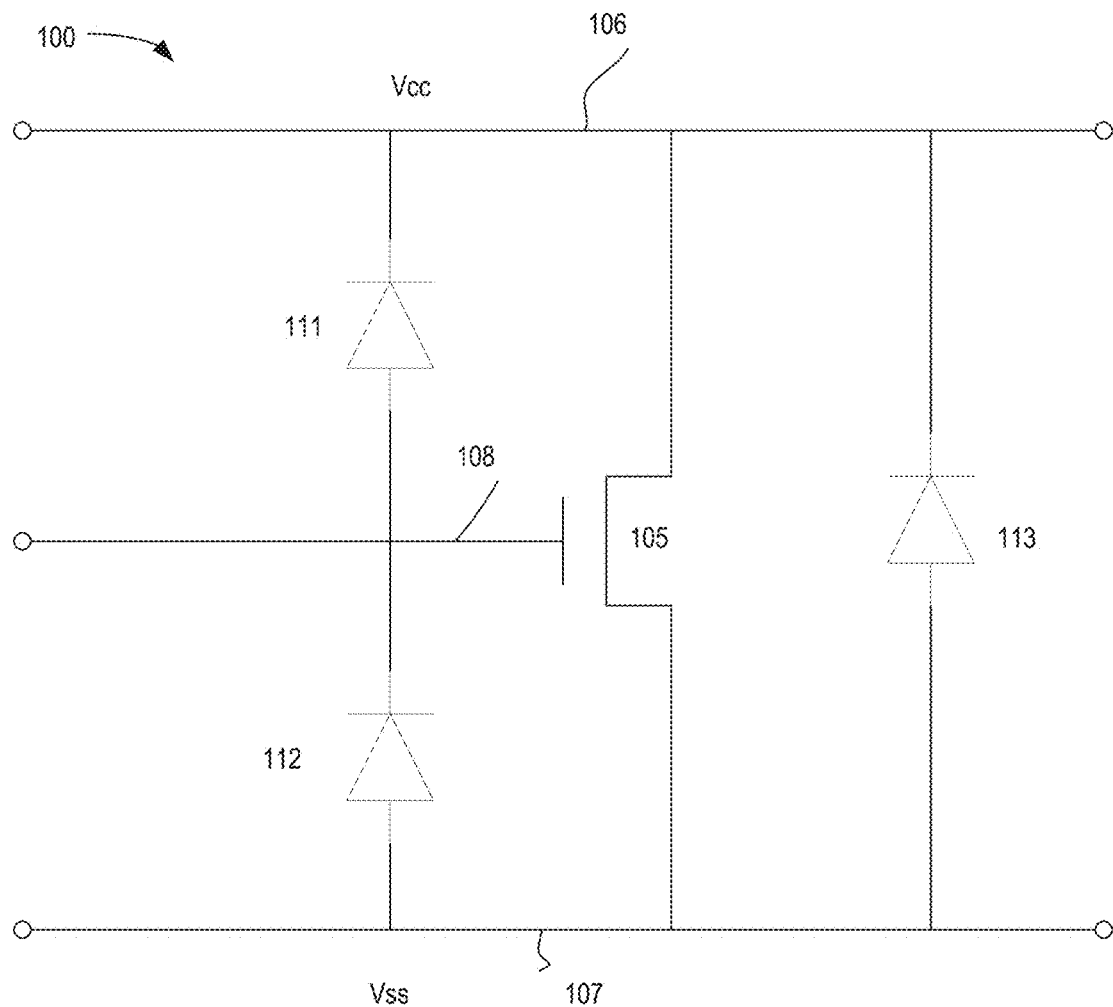
FIGS. 1A and 1B are schematics of diode protection circuits, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

FIG. 1A is a schematic of an electrical circuit 100 including at least one III-N heterojunction diode horizontally integrated or embedded within the heterostructure of a III-N transistor. With diodes embedded within a III-N transistor as further described below, circuit 100 may be implemented within a relatively small area.

Circuit 100 can be implemented as a single IC chip and may be implemented in any electronic device, such as, but not limited to, smartphones, ultrabook computers, embedded devices (e.g., internet of things, automotive applications, etc.), or wearables. In circuit 100, a III-N transistor 105 is to be protected from electrical surges by diodes 111, 112, and 113. Transistor 105 includes a first terminal (e.g., source) coupled to a first supply rail 106 maintained at a nominal supply voltage (e.g., $V_{cc}$), and a second terminal (e.g., drain) coupled to second supply rail 107 maintained at a nominal reference voltage (e.g., $V_{ss}$). A third terminal (e.g., gate) of transistor 105 is coupled to a signal input 108, which conveys an input voltage $V_{in}$. In circuit 100, transistor 105 is protected by diodes 111 and 112 connecting signal input 108 to the supply rails 106, 107 (e.g., $V_{cc}$ and $V_{ss}$, respectively), and by diode 113 connecting supply rail 106 to supply rail 107.

Under normal operating conditions, diodes 111, 112 and 113 are maintained in the off-state (e.g., reverse biased) such that signal input 108 is effectively disconnected from supply rails 106, 107 while transistor 105 is driven by the supply voltage across rails 106, 107. However, upon experiencing a potential surge between signal input 108 and supply rails 106 and 107, the transient will forward bias one or more of diodes 111, 112 and 113, turning them on. Which of diodes 111, 112 and 113 become forward biased is dependent on the charge polarity of the surge relative to the supply rail potentials. Charge accumulated at voltage input 108 is thereby dissipated or shunted through the diode path around transistor 105. In accordance with some embodiments, one or more diodes of a protection circuit (e.g., diodes 111, 112 and 113) employ a III-N heterostructure further employed by transistor 105. One or more of diodes 111, 112, 113 may be thereby vertically integrated monolithically with transistor 105, reducing the IC footprint of the integrated device. Such transistor-diode integrated device structures may have one or more of the features described further below. Any of the III-N heterostructure integrated devices described further herein may also be employed in any other suitable protection circuit designs. Any of the III-N heterostructure integrated devices described further herein may also be employed in circuits having functions other than ESD protection, such as, but not limited to, high voltage power management circuitry.

Figure 1B:
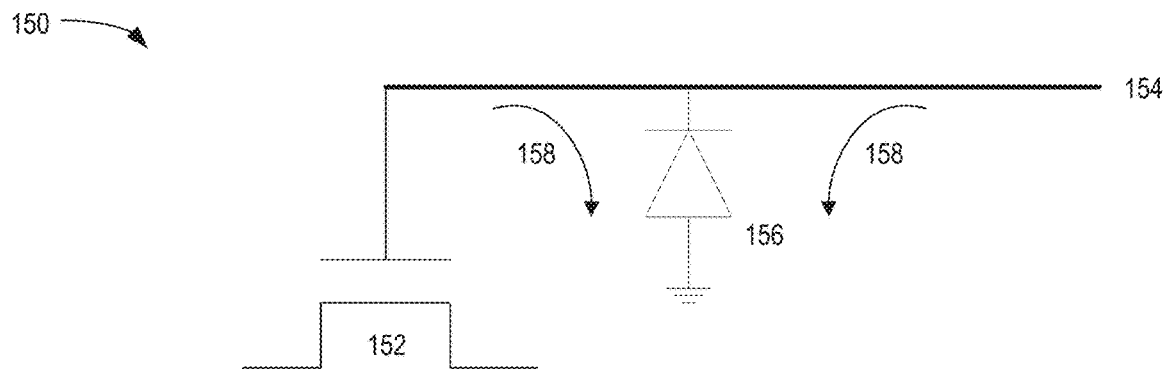

FIG. 1B is a schematic of an electrical circuit 150 including at least one III-N heterojunction diode horizontally integrated or embedded within the heterostructure of a III-N transistor. In circuit 150, a III-N transistor 152 is to be protected from antenna effects by antenna diode 156. Transistor 152, and in particular a thin layer gate oxide, may be vulnerable to damage from antenna effects as metal interconnects 154 are formed and processed above the gate. Plasma etching, for example, could lead to an overvoltage due to charge accumulation. Antenna diode 156 may provide charge dissipation path 158 to protect transistor 152 during the manufacturing processes. During normal operation, antenna diode 156 would not hinder transistor 152 provided the turn on voltage of transistor 152 is less than the turn on voltage of antenna diode 156.

Figure 2:
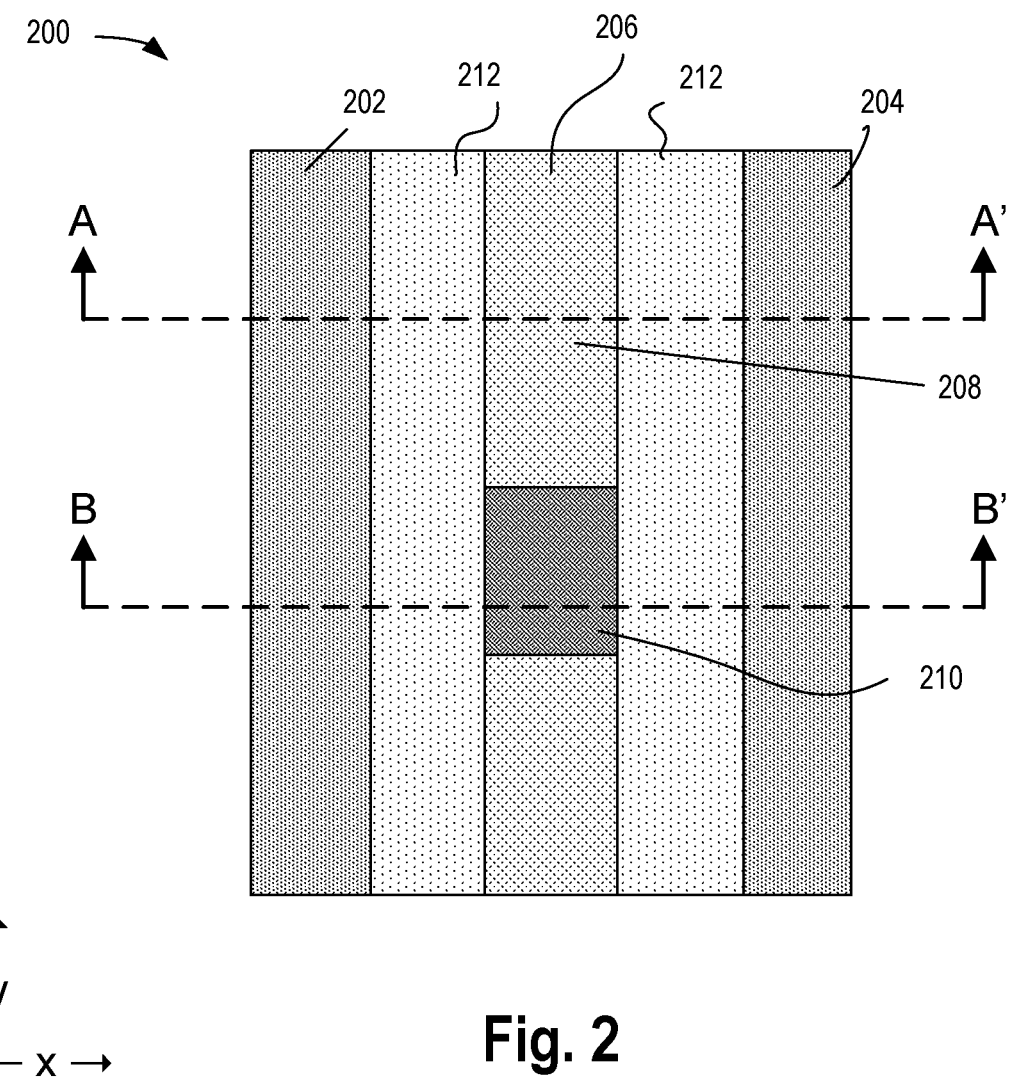
FIG. 2 is a plan view of an exemplary III-N heterojunction transistor including an embedded diode, in accordance with some embodiments.

FIG. 2 is plan view of an exemplary III-N heterojunction transistor including an embedded diode, in accordance with some embodiments. As shown IC structure 200 includes source 202, drain 204, gate electrode 206, transistor gate region 208, diode anode region 210, and III-N heterostructure 212, which is presented in more detail hereinafter. As shown, transistor gate region 208 may frame two sides of diode anode region 210, and may occupy a majority of gate electrode 206. However, in other embodiments, transistor gate region 208 and diode anode region 210 may appear to greater or lesser extents along gate electrode 206.

Figure 3A:
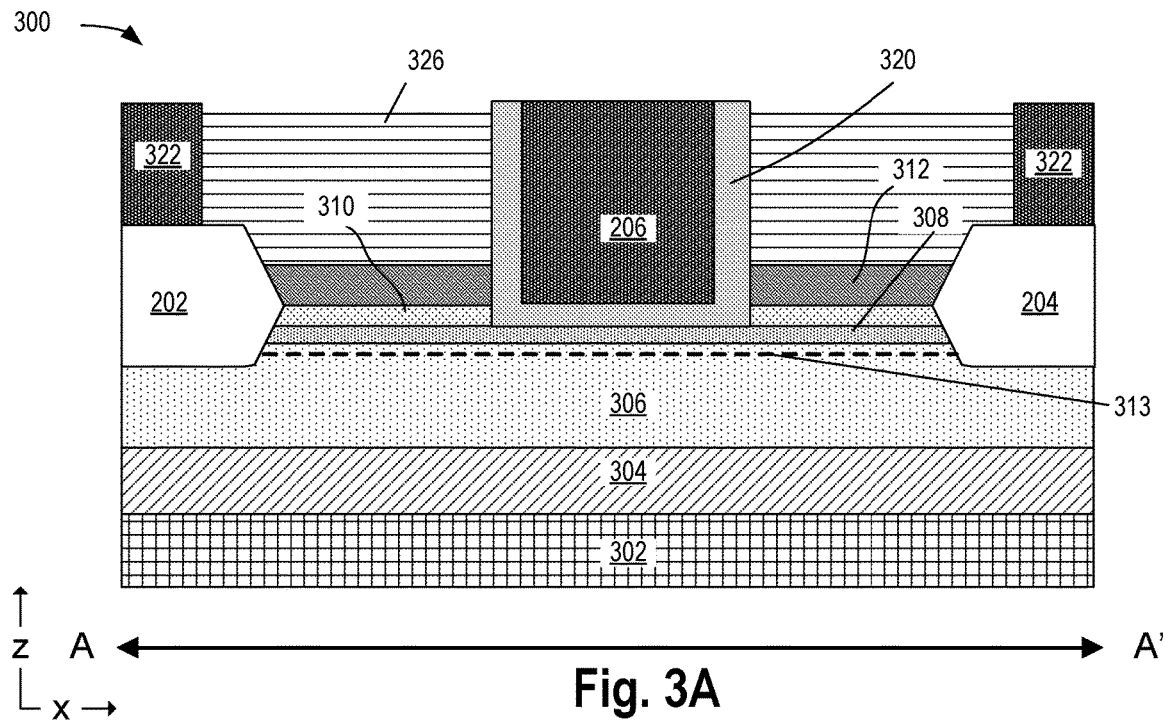
FIGS. 3A and 3B are cross-sectional views of the III-N heterojunction transistor shown in FIG. 2, in accordance with some embodiments.
Figure 3B:
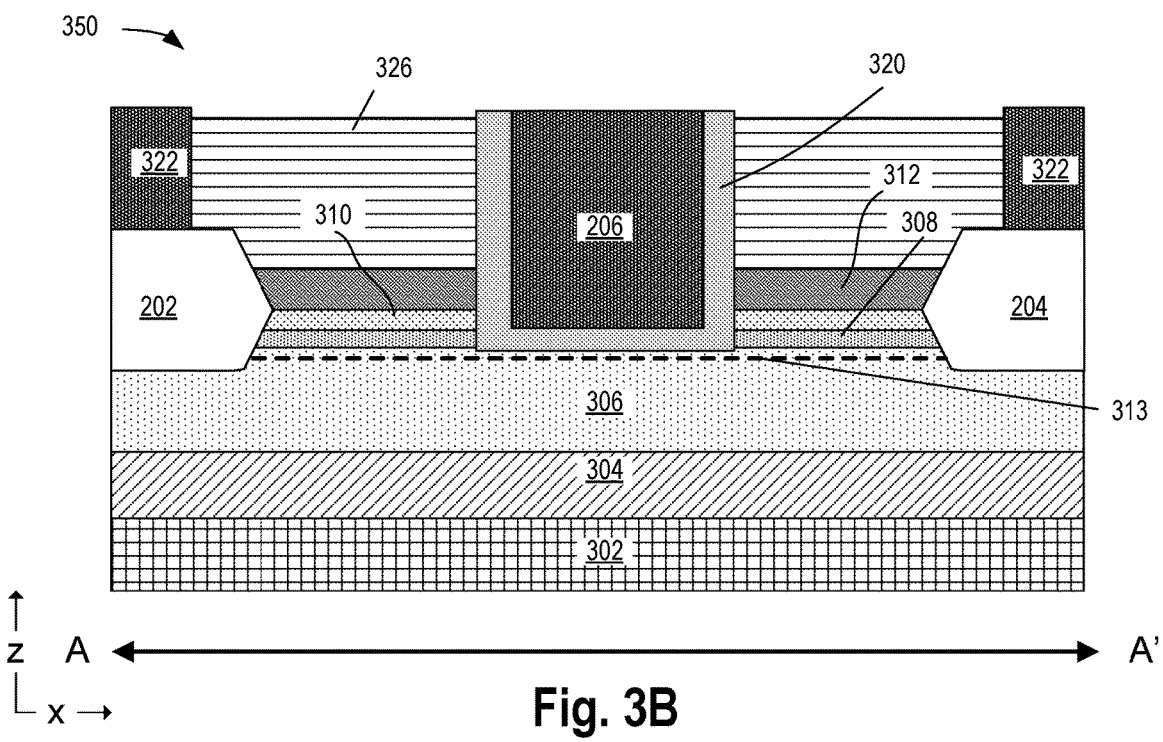

FIGS. 3A and 3B are cross-sectional views of IC structure 200 along the A-A' line illustrated in FIG. 2, in accordance with some embodiments. As shown in FIG. 3A, device 300 may include substrate 302, buffer layer 304, channel layer 306, polarization layer 308, barrier layer 310, capping layer 312, two-dimensional charge carrier sheet 313 (e.g., 2D electron gas or "2DEG"), source 202, drain 204, gate electrode 206, high k dielectric 320, contact metal 322, and spacer material 326. Device 300 may represent a high electron mobility transistor (HEMT).

In some embodiments, substrate 302 may be a SiC substrate. In other embodiments, substrate 302 is a cubic semiconductor, such as monocrystalline silicon. For such embodiments, template structures may be formed on a cubic substrate surface, such as a (100) surface. III-N crystals may also be grown on other surfaces (e.g., 110, 111, miscut or offcut, for example 2-10° toward [110] etc.). In some embodiments, substrate 302 may be material upon which the III-N crystal has been bonded, in which case substrate 302 may be crystalline, or not (e.g., glass, polymer, etc.).

Buffer layer 304 may be present to buffer channel layer 306 from substrate 302. In some embodiments, buffer layer 304 may include AlN or AlGaN, or other III-N or other materials chosen to differentiate from the material used for channel layer 306.

In some embodiments, a III-N heterostructure may include channel layer 306, polarization layer 308, and barrier layer 310. Polarization layer 308 comprises an alloy distinct from the alloy of channel layer 306, thereby inducing a variation in the polarization field strength (e.g., spontaneous and/or piezoelectric) between these two III-N layers. Where spontaneous and/or piezoelectric polarization field strengths are sufficiently different between polarization layer 308 and III-N channel layer 306, 2DEG 313 is formed within channel layer 306 in the absence of any externally applied field.

For some exemplary embodiments having Ga-polarity, polarization layer 308 has a higher Al content than III-N channel layer 306. Polarization layer 308 may be binary AlN. Polarization layer 308 may also be an AlGaN alloy. Exemplary AlGaN embodiments include 25-40% Al ($Al_xGa_{1-x}N$ where $0.25 \leq x \leq 0.4$). Polarization layer 308, or barrier layer 310, may also be an InAlN alloy or a quaternary alloy, which are also suitable as a polarization material and may offer advantages with respect to tuning the lattice constant to better match that of one or more other material layers (e.g., layers 306 and/or 310). Exemplary InAlN embodiments include less than 20% In ($In_xAl_{1-x}N$ where $0<x\leq 0.2$), with 17% In having the advantage of an exceptional lattice match with binary GaN. Exemplary quaternary alloys include $In_xGa_yAl_{1-x-y}N$ with $0<x\leq 0.2$ and $0<y\leq 0.2$.

In some embodiments, III-N channel layer 306 may be binary GaN. III-N channel layer 306 may also be an AlGaN or InAlN alloy, or even a quaternary alloy, as long as the polarization field strength difference between layers 306 and 308 is sufficient to induce formation of 2DEG 313.

In some advantageous embodiments, at least III-N channel layer 306 is intrinsic and not intentionally doped with impurities associated with a particular conductivity type. Channel layer 306 in the intrinsic state can be expected to have higher charge carrier mobility than is possible for a material of higher impurity doping. Intrinsic impurity (e.g., Si) levels in channel layer 306 are advantageously less than $1e17$ atoms/$cm^3$, and in some exemplary embodiments is between $1e14$ and $1e16$ atoms/$cm^3$.

In some embodiments, capping layer 312 may be included over barrier layer 310, while in other embodiments, capping layer 312 is not present. In some embodiments, where present, capping layer 312 may include dielectric material, such as an oxide, or another III-N material, for example.

Gate electrode 206 may be formed in a recess extending through two or more III-N heterostructure layers. As shown, gate electrode 206 is capacitively coupled through high k dielectric 320 to one or more layers of the III-N heterostructure (e.g., III-N polarization layer 308). High k dielectric 320 may be any high-k (e.g., bulk permittivity of 9, or more) or conventional dielectric material (e.g., bulk permittivity of 3.5-8) known to be suitable for the purpose in III-N FETs. In the illustrated example, gate electrode 206 is electrically insulated and/or decoupled from the III-N heterostructure through high k dielectric 320 on three sides of gate electrode 206. Spacer material 326 may be any low-k (e.g., bulk permittivity of 3, or less) or conventional dielectric material (e.g., bulk permittivity of 3.5-8) known to be suitable for the purpose of reducing capacitive coupling between gate electrodes and adjacent semiconductors.

The composition of gate electrode 206 may be selected based on the metal-semiconductor workfunction difference relative to III-N channel layer 306 to achieve a desired transistor threshold voltage. In some embodiments, where III-N channel layer 306 is binary GaN, gate electrode 206 advantageously includes at least one of Ni, W, Pt, or TiN. Each of these metals or metallic compounds may be associated with a particular work function (or metal-semiconductor work function difference) that has an impact transistor threshold voltage. Although gate electrode 206 is illustrated as homogeneous, a stack or laminate of metals may also be employed.

As shown in FIG. 3A, source 202 and drain 204 are within recesses in the III-N heterostructure that are located on opposite sides of gate electrode 206. The source and drain recesses also extend through III-N barrier layer 310, and polarization layer 308, landing on III-N channel layer 306.

In the illustrated example, source 202 and drain 204 are in physical contact with a c-plane (e.g., Ga-face) of III-N channel layer 306. Source 202 and drain 204 have access to an edge thickness of 2DEG 313 buried below the heterojunction between polarization layer 308 and III-N channel layer 306. Modulation of 2DEG 313 by the field effect of gate electrode 206 may thereby control electrical coupling between source 202 and drain 204. The junction between III-N channel layer 306 and source 202 and drain 204 may be a heterojunction with the composition of source 202 and drain 204 being distinct from that of at least III-N channel layer 306. In some embodiments, source 202 and drain 204 are also a III-N material. For example, source 202 and drain 204 may be InGaN. Some advantageous InGaN embodiments include 5-20% In ($In_xGa_{1-x}N$ with $5\%\leq x\leq 20\%$). The alloy composition of source 202 and drain 204 may be constant or graded between III-N channel layer 306 and contact metal 322. For some embodiments, source 202 and drain 204 are epitaxial, having the same crystallinity and orientation as III-N channel layer 306.

Source 202 and drain 204 advantageously include impurity dopants to have a first conductivity type (e.g., Si donor impurities for n-type conductivity). The doping level of source 202 and drain 204 is advantageously as high as practical for lowest transistor terminal resistance. In some exemplary embodiments where source 202 and/or drain 204 is a III-N alloy, the impurity dopant level is over $1e19$ atoms/$cm^3$, and more advantageously over $1e20$ atoms/$cm^3$. Si is one exemplary dopant atom for which such high (N+) doping levels may be achieved in III-N alloys. An alternative N-type dopant is Ge.

For embodiments where source 202 and drain 204 have n-type conductivity, contact metal 322 may be any suitable metal, such as at least one of Ti, Al, or W, for example. Other metals known to make ohmic contacts to n-type III-N materials may be suitable alternatives for making ohmic contact to source 202 and drain 204.

As shown in FIG. 3B, device 350 may represent an alternative embodiment of region 208. Gate electrode 206 is located within a recess in the III-N heterostructure that extends a depth through III-N material layers 310 and 308, and into channel layer 306. The recess depth may be predetermined to tune threshold voltage ($V_t$) of the transistor. For example, recessed gate electrode 206 may be at a depth relative to III-N channel layer 306 to ensure a positive $V_t$ for an enhancement mode n-type transistor.

Figure 4A:
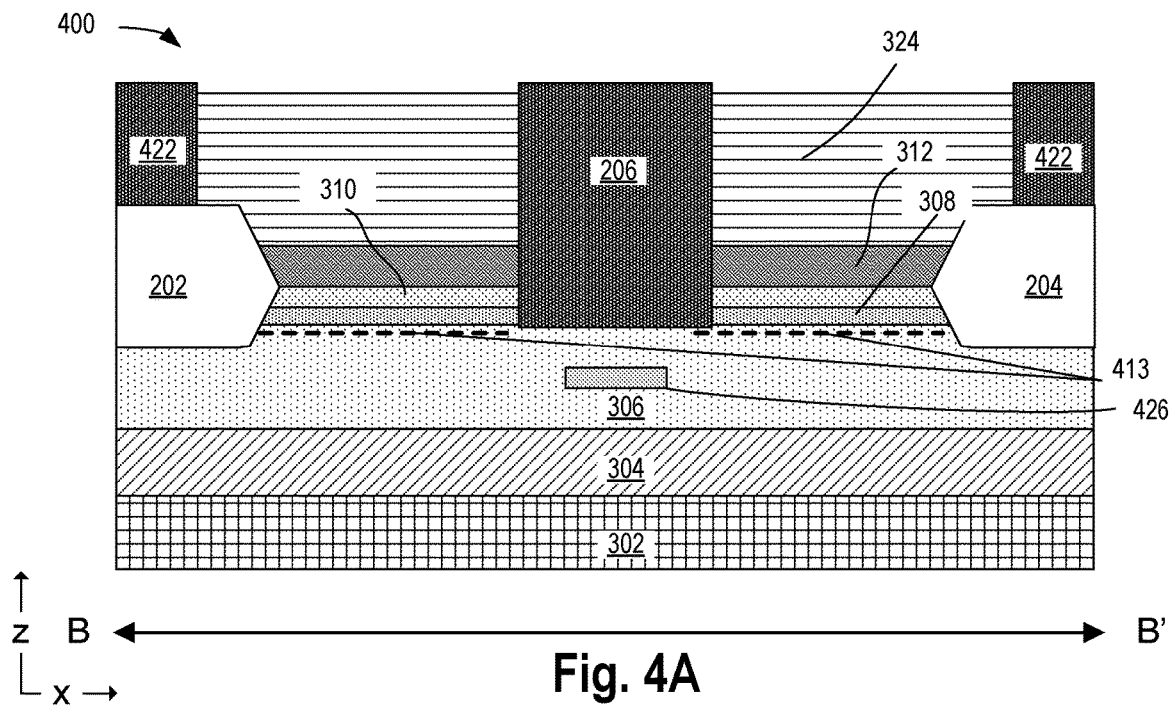
FIGS. 4A and 4B are cross-sectional views of the III-N heterojunction embedded diode shown in FIG. 2, in accordance with some embodiments.
Figure 4B:
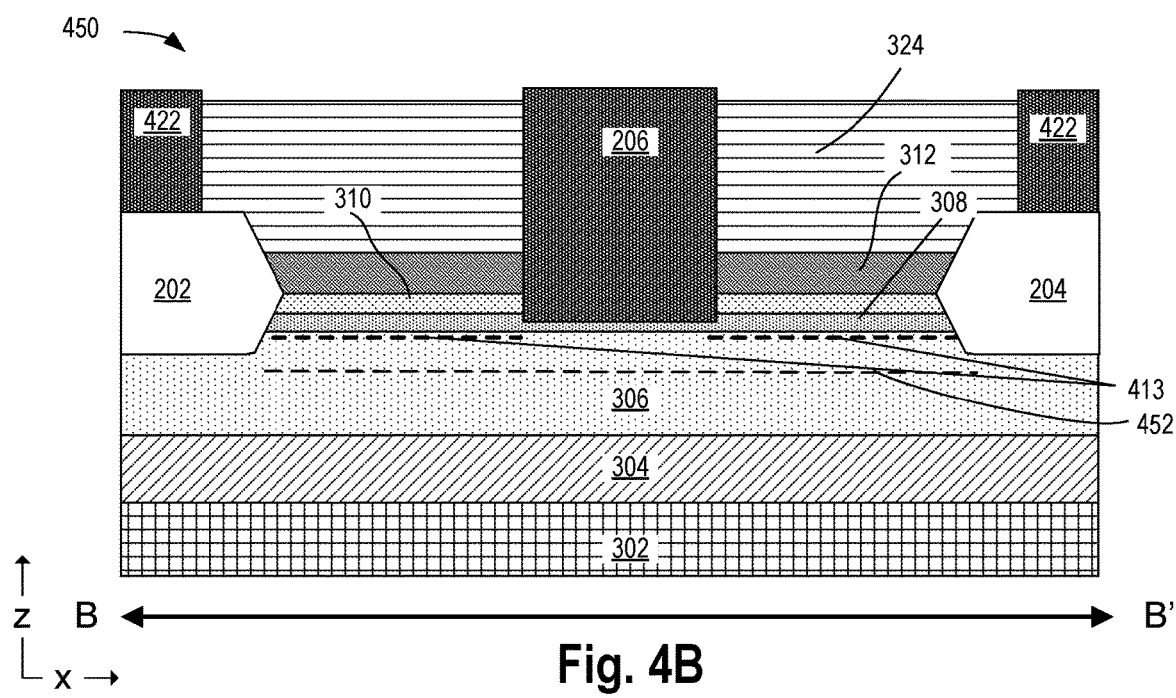

FIGS. 4A and 4B are cross-sectional views of IC structure 200 along the B-B' line illustrated in FIG. 2, in accordance with some embodiments. As shown in FIG. 4A, device 400 may include substrate 302, buffer layer 304, channel layer 306, polarization layer 308, barrier layer 310, capping layer 312, 2DEG 413, source (cathode) 202, drain (cathode) 204, gate electrode (diode anode) 206, contact metal 422, spacer material 324, and implant doping layer 426. Device 400 may include many of the same features previously presented in reference to devices 300 and 350. One skilled in the art would appreciate that a direct (or substantially direct) connection between 2DEG 413 and source (cathode) 202 would tend to reduce on resistance of the associated Schottky diode, thereby enhancing ESD protection.

In the example illustrated in FIG. 4A, gate electrode (diode anode) 206 is electrically coupled with the III-N heterostructure as there is no insulating high k dielectric. This creates a metal-semiconductor junction with gate electrode (diode anode) 206 and one or more layers of the III-N heterostructure. In some embodiments, this metal-semiconductor junction is non-rectifying, and advantageously an ohmic junction, enabling gate electrode (diode anode) 206 to be directly coupled to source (cathode) 202 and drain (cathode) 204 of the integrated III-N diode, which may provide ESD protection to the integrated transistor. Also, channel layer 306 includes implant doping layer 426, which may include silicon doping for an increased presence of charge carriers.

As shown in FIG. 4B, device 450 may include delta doping layer 452, instead of, or in addition to, implant doping layer 426, which may increase the presence of charge carriers by introducing dopants, such as silicon, during the epitaxial growth of channel layer 306. Also, gate electrode (diode anode) 206 may reside in a recess that only partially extends through polarization layer 308. In some embodiments, gate electrode (diode anode) 206 may be separated from channel layer 306 by about a 1-3 nm portion of polarization layer 308.

Figure 5:
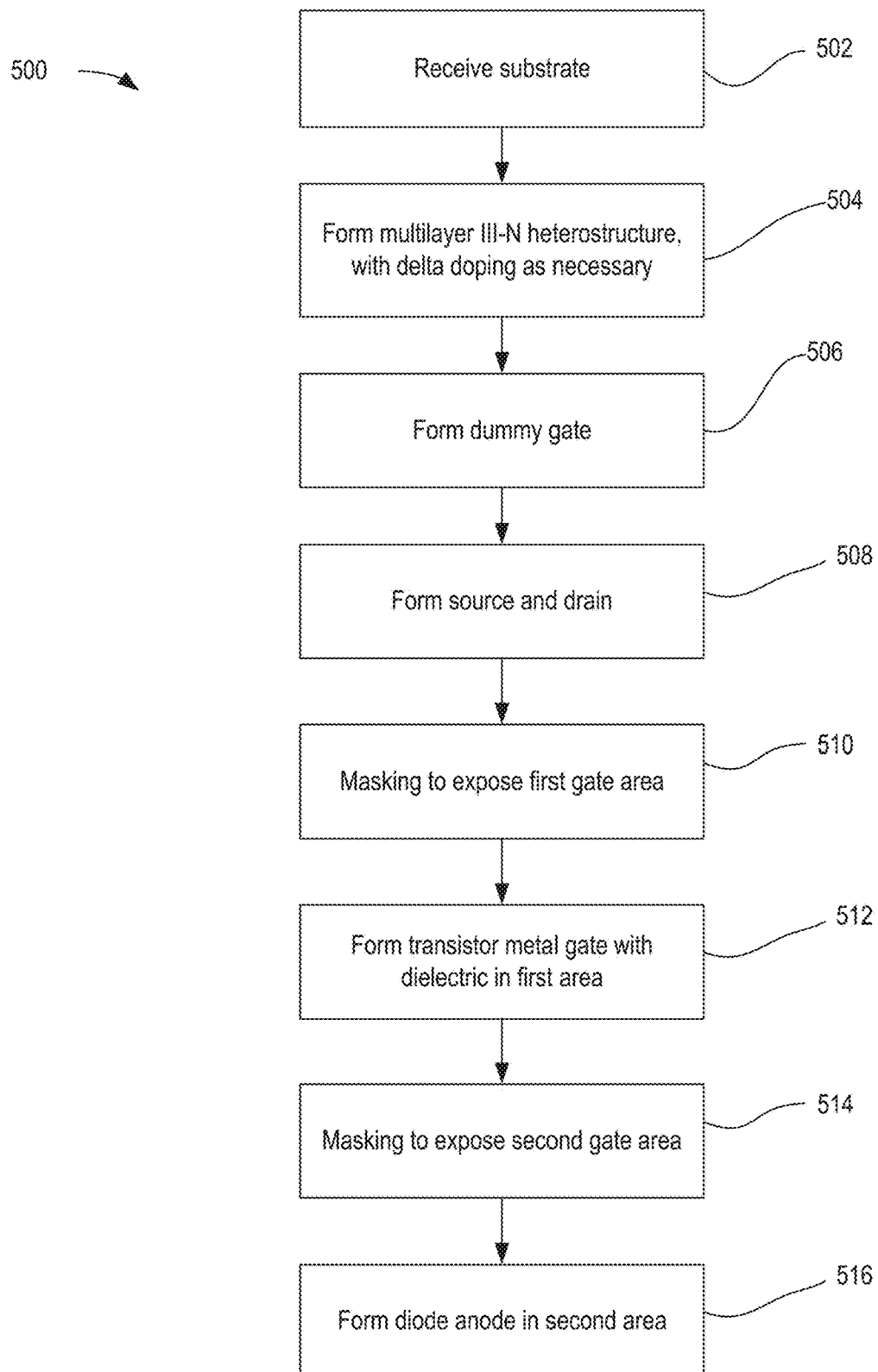
FIG. 5 is a flow diagram illustrating methods of forming III-N heterojunction transistor structures including an embedded diode, in accordance with some embodiments.

The III-N devices described above may be fabricated using a variety of methods. FIG. 5 is a flow diagram illustrating methods 500 for forming III-N Schottky diodes, in accordance with some embodiments. Methods 500 begin at operation 502 where a substrate including a crystalline seed layer is received. The substrate received at operation 502 may be any of those described above, for example. At operation 504, a III-N epitaxial growth process is employed to grow a crystalline Ga-polar III-N heterostructure on the substrate seeding surface. The heterostructure grown induces the formation of a 2D charge carrier sheet. In some embodiments, delta doping is included in the epitaxial growth of a channel layer. The epitaxial growth performed at operation 504 may form a continuous crystal over an entire surface of a substrate, or may be limited to islands or mesas occupying only a portion of a substrate surface as controlled through a templating pattern. Alternatively, a Ga-face of a III-N crystal grown with any polarity is exposed at operation 504. For example, a III-N crystal may be first grown with N-polarity over a substrate, and the substrate then removed to expose the Ga-face to subsequent processing.

At operation 506, a dummy gate may be formed by any suitable method to define a location for an eventual gate electrode. In some embodiments, a poly-silicon dummy gate may be formed. Methods 500 continue at operation 508 where source and drain semiconductor is formed in a manner that ensures the source and drain semiconductor are coupled to the 2D charge carrier sheet present within the heterostructure. The formation process may further entail forming a recess through layers of the III-N heterostructure and deposition or growth of semiconductor within the recess. Any patterning techniques may be employed to form the recess and any epitaxial growth technique or deposition process may be employed, for example to form any of the source and drain semiconductor compositions described above.

Methods 500 continue at operation 510 where known masking techniques may expose only a portion of the dummy gate. At operation 512, a transistor gate electrode is formed, including high k dielectric, in a manner that ensures the gate electrode will be coupled (e.g., capacitively) to the 2D charge carrier sheet. Next, at operation 514, the transistor gate electrode is masked and a second area of the dummy gate is exposed. Methods 500 conclude at operation 516 where a diode anode is formed in a manner that ensures the anode will be coupled (e.g., with rectification) to the 2D charge carrier sheet. Any deposition process(es) suitable for the chosen gate electrode may be employed. For example, one or more of physical vapor deposition, chemical vapor deposition, or atomic layer deposition may be employed to deposit one or more gate dielectric layer and one or more the metal or metallic compound, such as any of those described elsewhere herein.

Figure 6:
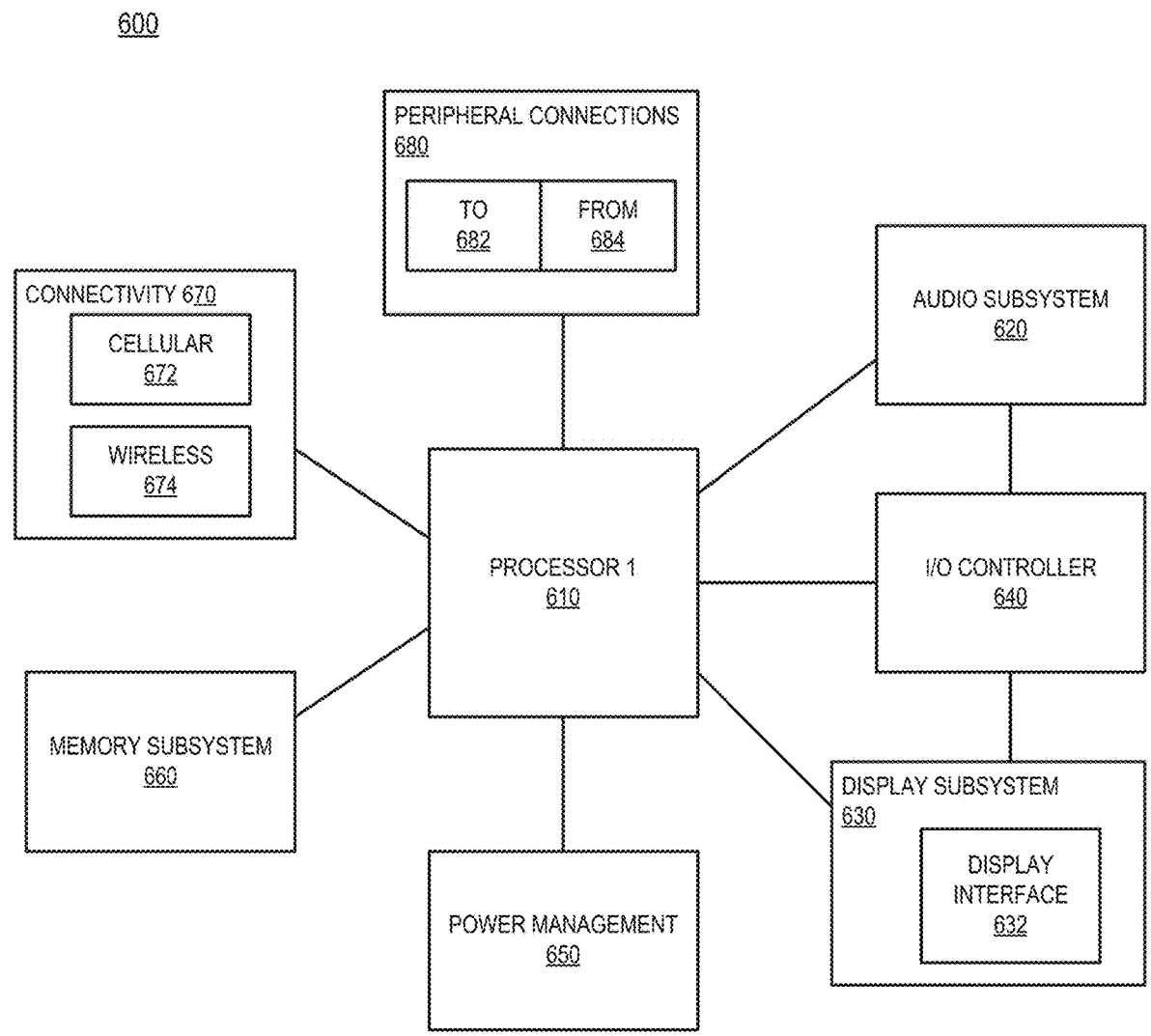
FIG. 6 illustrates a smart device or a computer system or a SoC (System-on-Chip) which includes a III-N heterojunction transistor structure including an embedded diode, in accordance with some embodiments.

FIG. 6 illustrates a smart device or a computer system or a SoC (System-on-Chip) which includes a III-N heterojunction transistor structure with an embedded diode, according to some embodiments. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600. In some embodiments, one or more components of computing device 600, for example cellular 672 and/or wireless 674, include a III-N heterojunction transistor structure with an embedded diode as described above, for example coupled with a transceiver.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Connectivity 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one example, a Group III-Nitride (III-N) device structure is provided comprising: a heterostructure having three or more layers comprising III-N material; a cathode comprising donor dopants, wherein the cathode is on a first layer of the heterostructure; an anode within a recess that extends through two or more of the layers of the heterostructure, wherein the anode comprises a first region wherein the anode is separated from the heterostructure by a high k dielectric material, and a second region wherein the anode is in direct contact with the heterostructure; and a conducting region in the first layer in direct contact to the cathode and conductively connected to the anode.

In some embodiments, the conducting region in the first layer is formed by polarization fields of a second layer. In some embodiments, a Schottky barrier is formed between the conducting region in the first layer and the anode. In some embodiments, the conducting region in the first layer extents below the anode. In some embodiments, the conducting region in the first layer below the anode is formed by polarization fields of the second layer extending below the anode, while the thickness of the portion of the second layer below the anode is reduced compared to the thickness of the portion of the second layer extending between anode and cathode. In some embodiments, the first layer of the heterostructure comprises GaN and a second layer of the heterostructure comprises AlN. In some embodiments, the second anode region extends further into the heterostructure than the first anode region. In some embodiments, the second anode region is separated from the first layer of the heterostructure by about a 1-3 nm portion of the second layer of the heterostructure. In some embodiments, the first anode region comprises high k dielectric material on three sides of the anode. In some embodiments, the first anode region is on the first layer of the heterostructure. Some embodiments also include a second first anode region, wherein the first anode regions frame the second anode region. In some embodiments, the anode comprises Ni. Some embodiments also include donor dopants in the first layer of the heterostructure, wherein the donor dopants comprise a delta doping layer or an implant doping layer.

In another example, a computer platform is provided comprising: one or more transceiver; a processor communicatively coupled to the transceiver; and an antenna coupled to the transceiver, wherein the transceiver is coupled to a III-N device comprising: a heterostructure having three or more layers comprising III-N material; a source and a drain comprising donor dopants, wherein the source and the drain are on a first layer of the heterostructure and wherein the source and the drain extend beyond the heterostructure; and a gate electrode within a recess that extends through two or more of the layers, wherein the gate electrode comprises a first region wherein the gate electrode is separated from the heterostructure by a high k dielectric material, and a second region wherein the gate electrode is in direct contact with the heterostructure.

In some embodiments, the first layer of the heterostructure comprises GaN and a second layer of the heterostructure comprises AlN. In some embodiments, the second gate electrode region extends further into the heterostructure than the first gate electrode region. In some embodiments, the second gate electrode region is separated from the first layer of the heterostructure by about a 1-3 nm portion of the second layer of the heterostructure. In some embodiments, the first gate electrode region comprises high k dielectric material on three sides of the gate electrode. In some embodiments, the first gate electrode region is on the first layer of the heterostructure. Some embodiments also include a second first gate electrode region, wherein the first gate electrode regions frame the second gate electrode region.

In another example, a method of forming a Group III-Nitride (III-N) device structure is provided comprising: forming a heterostructure comprising three or more III-N material layers; forming a source and a drain semiconductor on the first layer of the heterostructure, wherein the source and drain extend beyond the heterostructure; and forming a gate electrode within a recess that extends through two or more of the layers of the heterostructure, wherein the gate electrode comprises a first region wherein the gate electrode is separated from the heterostructure by a high k dielectric material, and a second region wherein the gate electrode is in direct contact with the heterostructure.

In some embodiments, forming the heterostructure comprising forming the first layer of the heterostructure comprising GaN and forming a second layer of the heterostructure comprising AlN. In some embodiments, forming the gate electrode comprises forming the second gate electrode region extending further into the heterostructure than the first gate electrode region. In some embodiments, forming the gate electrode comprises forming the second gate electrode region separated from the first layer of the heterostructure by about a 1-3 nm portion of the second layer of the heterostructure. In some embodiments, forming the gate electrode comprises forming the first gate electrode region comprising high k dielectric material on three sides of the gate electrode. Some embodiments also include forming a second first gate electrode region, wherein the first gate electrode regions frame the second gate electrode region. In some embodiments, forming the gate electrode comprises forming the first gate electrode region on the first layer of the heterostructure. Some embodiments also include forming donor dopants in the first layer of the heterostructure.

In another example, a system is provided comprising: a display subsystem; a wireless communication interface; and an integrated circuit device, the integrated circuit device comprising: a heterostructure having three or more layers comprising III-N material; a cathode comprising donor dopants, wherein the cathode is on a first layer of the heterostructure; an anode within a recess that extends through two or more of the layers of the heterostructure, wherein the anode comprises a first region wherein the anode is separated from the heterostructure by a high k dielectric material, and a second region wherein the anode is in direct contact with the heterostructure; and a conducting region in the first layer in direct contact to the cathode and conductively connected to the anode.

In some embodiments, the conducting region in the first layer is formed by polarization fields of a second layer. In some embodiments, a Schottky barrier is formed between the conducting region in the first layer and the anode. In some embodiments, the conducting region in the first layer extents below the anode. In some embodiments, the conducting region in the first layer below the anode is formed by polarization fields of the second layer extending below the anode, while the thickness of the portion of the second layer below the anode is reduced compared to the thickness of the portion of the second layer extending between anode and cathode. In some embodiments, the first layer of the heterostructure comprises GaN and a second layer of the heterostructure comprises AlN. In some embodiments, the first anode region comprises high k dielectric material on three sides of the anode. Some embodiments also include donor dopants in the first layer of the heterostructure, wherein the donor dopants comprise a delta doping layer or an implant doping layer.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated Group III-Nitride (III-N) transistor and diode structure, comprising:
   an electrode material layer having a contiguous length that is over both a transistor channel region and an adjacent diode anode region of the integrated III-N transistor and diode structure;
   a pair of III-N materials of a first conductivity type on opposite sides of the electrode material layer along the contiguous length;
   a first III-N material layer that extends the contiguous length and spans a width between the pair of III-N materials of the first conductivity type; and
   a second III-N material layer over the first III-N material layer, wherein the second III-N material layer extends the contiguous length and spans a width between the electrode material layer and each of the pair of III-N materials of the first conductivity type, and wherein:
      within the transistor channel region, the electrode material layer is separated from the first III-N material layer by a gate dielectric material that is absent from between the electrode material layer and the first III-N material layer within the diode anode region; and
      within the diode anode region, the electrode material layer is in direct contact with at least one of the first or second III-N material layers.

2. The integrated III-N transistor and diode structure of claim 1, wherein:
   the electrode material layer and the pair of III-N materials of the first conductivity type are all substantially parallel to each other along the contiguous length; and
   the transistor gate region is at an end of the diode anode region.

3. The integrated III-N transistor and diode structure of claim 1, wherein, within the diode anode region, the electrode material layer is recessed at least partially into the second III-N material layer, and is recessed further than the electrode material layer is recessed into the second III-N material layer within the transistor region.

4. The integrated III-N transistor and diode structure of claim 1, wherein within the diode anode region, the electrode material layer is in direct contact with the first III-N material layer.

5. The integrated III-N transistor and diode structure of claim 1, wherein the first III-N material layer comprises more donor dopants within the anode diode region than within the transistor region.

6. The integrated III-N transistor and diode structure of claim 5, wherein the donor dopants comprise a delta doping layer.

7. The integrated III-N transistor and diode structure of claim 5, wherein the donor dopants comprise silicon and, within the transistor region, the first III-N material layer comprises silicon at a concentration of less than 1e17 atoms/cm$^3$.

8. The integrated III-N transistor and diode structure of claim 1, further comprising:
   a first contact metal in contact with a first of the pair of III-N materials of the first conductivity type;
   a second contact metal in contact with a second of the pair of III-N materials of the first conductivity type; and
   a spacer dielectric material between the electrode material layer and each of the first and second contact metals.

9. The integrated III-N transistor and diode structure of claim 1, wherein:
   the first conductivity type is n-type, and the pair of III-N materials comprise donor impurities;
   the first III-N material layer comprises Ga and N; and
   the second III-N material layer comprises Al and N.

10. The integrated III-N transistor and diode structure of claim 9, wherein:
    the first III-N material layer comprises binary GaN; and
    the second III-N material layer comprises binary AN.

11. The integrated III-N transistor and diode structure of claim 9, wherein:
    the first III-N material layer is over a substrate comprising SiC or crystalline silicon.

12. The integrated III-N transistor and diode structure of claim 1, wherein the gate dielectric material comprises a high-K material with a bulk permittivity of 9, or more.

13. A computer platform comprising:
    one or more transceivers;
    a processor communicatively coupled to the transceiver; and
    an antenna coupled to the transceiver, wherein the transceiver comprises the integrated III-N transistor and diode structure of claim 1.

14. A method of fabricating an integrated Group III-Nitride (III-N) transistor and diode structure, the method comprising:
    forming a III-N heterostructure over a substrate;
    forming a dummy gate that extends a length over a transistor gate region of the III-N heterostructure, and over an adjacent diode anode region of the III-N heterostructure;
    forming a pair of III-N materials of a first conductivity type on opposite sides of the dummy gate and that also extend the length;
    replacing a first portion of the dummy gate with a gate stack comprising a gate dielectric material and an electrode over the gate dielectric material;
    replacing a second portion of the dummy gate with the electrode in direct contact with at least one III-N material layer of the III-N heterostructure.

15. The method of claim 14, wherein:
    replacing the first portion of the dummy gate comprises masking to expose the dummy gate within the transistor region; and
    replacing the second portion of the dummy gate comprises masking to expose the dummy gate within the diode anode region.

16. The method of claim 15, wherein replacing the first or second portion of the dummy gate comprises etching into the III-N heterostructure.

17. The method of claim 14, wherein the III-N heterostructure comprises a first III-N material layer comprising G and N, and a second III-N material layer comprising Al and N over the first III-N material layer.

18. The method of claim 14, wherein the gate dielectric material comprises a high-K material with a bulk permittivity of 9, or more.

* * * * *